United States Patent
Kasahara

(12) 
(10) Patent No.: US 7,649,423 B2
(45) Date of Patent: Jan. 19, 2010

(54) OVEN CONTROLLED CRYSTAL OSCILLATOR

(75) Inventor: Kenji Kasahara, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 156 days.

(21) Appl. No.: 11/892,862

(22) Filed: Aug. 28, 2007

(65) Prior Publication Data

US 2008/0055011 A1    Mar. 6, 2008

(30) Foreign Application Priority Data

Aug. 29, 2006    (JP)   ............................ P2006-232525

(51) Int. Cl.
    *H03B 1/00*      (2006.01)
(52) U.S. Cl. .............................. 331/69; 331/66; 331/68; 331/176; 331/158; 310/343; 310/344
(58) Field of Classification Search ................. 331/176, 331/158, 108 C, 66, 68, 69; 310/343, 344
See application file for complete search history.

(56) References Cited

U.S. PATENT DOCUMENTS 6,559,728 B1 *    5/2003    Fry ............................. 331/69

7,310,024 B2 *    12/2007    Milliren et al. ............... 331/69

FOREIGN PATENT DOCUMENTS

| JP | H11-214929 | 8/1999 |
|---|---|---|
| JP | 2001-127579 | 5/2001 |
| JP | 2003-224425 | 8/2003 |
| JP | 2005-117189 | 4/2005 |

* cited by examiner

*Primary Examiner*—Arnold Kinkead
(74) *Attorney, Agent, or Firm*—Jacobson Holman PLLC

(57) ABSTRACT

An oven controlled crystal oscillator capable of uniformly transmitting heat from the heat generator to improve the frequency-temperature characteristics. The oven controlled crystal oscillator includes a high thermal conductivity plate having high thermal conductivity and provided on one side of a substrate, where the crystal resonator is provided, in such a manner to contact the resistors, the transistor, the crystal resonator, and the temperature sensor. This structure can transmit heat from the resistors and the transistor as the heat generator to the crystal resonator and the temperature sensor rapidly with less heat loss to assure a uniform temperature inside the substrate, thereby improving the frequency-temperature characteristics.

19 Claims, 4 Drawing Sheets

OVEN CONTROLLED CRYSTAL OSCILLATOR

BACKGROUND OF THE INVENTION

1. Field of the Invention

The present invention relates to an oven controlled crystal oscillator (OCXO), and particularly to an oven controlled crystal oscillator having stable frequency-temperature characteristics.

2. Description of the Related Art

The oven controlled crystal oscillator is a crystal oscillator having a crystal resonator mounted in a case in which temperature is kept constant. Since the oven controlled crystal oscillator is less likely to be affected by environmental temperature, it has stable frequency characteristics.

The structure of a conventional oven controlled crystal oscillator will be described with reference to FIGS. 4 and 5. FIG. 4 is a sectional view showing the structure of the conventional oven controlled crystal oscillator. FIG. 5 is an explanatory drawing showing the structure of a substrate 1 in the conventional oven controlled crystal oscillator, where (a) is a plan view, (b) is a top view, (c) is a left side view, (d) is a bottom view, and (e) is a right side view.

As shown in FIGS. 4 and 5, in the conventional oven controlled crystal oscillator (hereinafter referred to as "OCXO"), the substrate 1 with various electronic components such as a crystal resonator mounted thereon is provided in a space enclosed by a cover 7 and a base 8 in such a manner to be fixed to the base 8 with pins 9.

A surface-mounted crystal resonator 2, a temperature sensor 5, resistors 3, and a transistor 4 are provided on one side of the substrate 1 (on the side to face the base 8 in FIG. 4), and other electronic components 6 such as an oscillation circuit and a temperature control circuit are provided on the other side of the substrate 1. Note that some of the electronic components 6 are also provided on the same side as the crystal resonator 2. The resistors 3 and the transistor 4 form a heat generator for generating heat.

Then, as shown in FIG. 5(a), the temperature sensor 5, the resistors 3, and the transistor 4 are arranged around the crystal resonator 2, so that heat generated by the resistors 3 and the transistor 4 is transmitted to the crystal resonator 2 and the temperature sensor 5 through the substrate 1 and substrate wiring.

A conventional technique for implementing the oven controlled crystal oscillator is disclosed in Japanese Patent Application Laid-Open No. 11-214929 (Applicant: TOYO Communication Equipment Co., Ltd.; Inventor: Tomio Sato) laid open on Aug. 6, 1999 and entitled "Piezoelectric Oscillator."

In this conventional technique, an oscillation circuit, a plurality of surface-mounted heaters, and a temperature control circuit are arranged on a substrate to heat the case of a piezoelectric resonator and a lead terminal portion of the piezoelectric resonator simultaneously by different heaters in order to heat the piezoelectric resonator, the oscillation circuit, and the temperature control circuit simultaneously, enabling to provide a crystal oscillator with excellent starting characteristics and warm-up time characteristics.

As other conventional techniques for implementing the oven controlled crystal oscillator, there are disclosed in Japanese Patent Application Laid-Open No. 2001-127579, No. 2003-224425, and No. 2005-117189.

However, since the structures of the conventional oven controlled crystal oscillators have a problem that heat generated by the heat generator consisting such as of the resistors 3 and the transistor 4 is hard to be transmitted uniformly over the substrate, a temperature difference can be produced between the temperature sensor 5 and the crystal resonator 2 or any of the other electronic components. In such a case, reliable temperature control cannot be performed, resulting in degradation of the frequency-temperature characteristics of the output frequency.

SUMMARY OF THE INVENTION

The present invention has been made in view of the actual conditions, and it is an object thereof to provide an oven controlled crystal oscillator capable of improving frequency-temperature characteristics by transmitting heat generated by a heat generator uniformly over a substrate to keep the temperature of the substrate uniform in order to ensure reliable, stable temperature control.

In order to solve the problem of the above conventional examples, the present invention provides an oven controlled crystal oscillator having a surface-mounted crystal resonator, a heat generator including a resistor and a transistor, and a temperature sensor on one side of a substrate, and other electronic components on the other side. The oven controlled crystal oscillator includes a high thermal conductivity member made of a material having high thermal conductivity and provided on the one side of the substrate, where the crystal resonator, the heat generator, and the temperature sensor are provided, in such a manner to contact the crystal resonator, the heat generator, and the temperature sensor. In this structure, since heat emitted from the heat generator is transmitted to the crystal resonator and the temperature sensor through the high thermal conductivity member, temperature variations inside the substrate can be reduced to perform reliable temperature control, thereby improving the frequency-temperature characteristics.

According to the present invention, the oven controlled crystal oscillator can also be configured such that the high thermal conductivity member is a metal plate, a ceramic plate, or a silicon plate, and is provided on the substrate through an adhesive having high thermal conductivity. In this case, since the high thermal conductivity member can be secured with the adhesive while assuring sufficient thermal conductivity, the frequency-temperature characteristics can be improved.

Further, according to the present invention, the oven controlled crystal oscillator can be configured such that the high thermal conductivity member is provided to cover the resistor thinner in thickness than the crystal resonator and contact the side faces of the crystal resonator. In this case, since the high thermal conductivity member can be provided to fit in a space defined by a difference in thickness between the crystal resonator and the resistor, it can be formed without an increase in the total device size and thickness, so that there is no need to change the shape of a cover for housing the device, and hence there is no danger of interfering with the demand for smaller devices.

Further, according to the present invention, the oven controlled crystal oscillator can be configured such that the high thermal conductivity member is formed by coating a resin having high thermal conductivity. In this case, since the high thermal conductivity member can be mounted on the substrate easily using an inexpensive material, an oven controlled crystal oscillator having proper frequency-temperature characteristics can be easily implemented.

Further, according to the present invention, the oven controlled crystal oscillator can be configured such that a thermal insulating member having low thermal conductivity is provided to cover the high thermal conductivity member. In this case, since heat radiation from the surface of the high thermal conductivity member can be prevented to make it easy to keep the temperature of the substrate uniform, more stable temperature control can be performed, thereby improving the frequency-temperature characteristics.

DESCRIPTION OF REFERENCE NUMERALS

1 . . . Substrate, 2 . . . Crystal Resonator, 3 . . . Resistor, 4 . . . Transistor, 5 . . . Temperature Sensor, 6 . . . Other Electronic Components, 7 . . . Cover, 8 . . . Base, 9 . . . Pin, 10 . . . High Thermal Conductivity Plate, 11 . . . High Thermal Conductive Resin

DESCRIPTION OF THE PREFERRED EMBODIMENTS

Embodiments of the present invention will now be described with reference to the accompanying drawings.

Oven controlled crystal oscillators according to embodiments of the present invention include a heat-conducting member (high thermal conductivity member) made of a material having high thermal conductivity and located on one side of a substrate, where a crystal resonator is provided, in such a manner to contact a resistor, a transistor, the crystal resonator, and a temperature sensor so as to transmit heat from the resistor and the transistor as a heat generator rapidly to the crystal resonator, the temperature sensor, etc. through the heat-conducting member so as to assure no temperature difference inside the substrate, thereby making it possible to improve the reliability of temperature control and the frequency-temperature characteristics.

Figure 1:
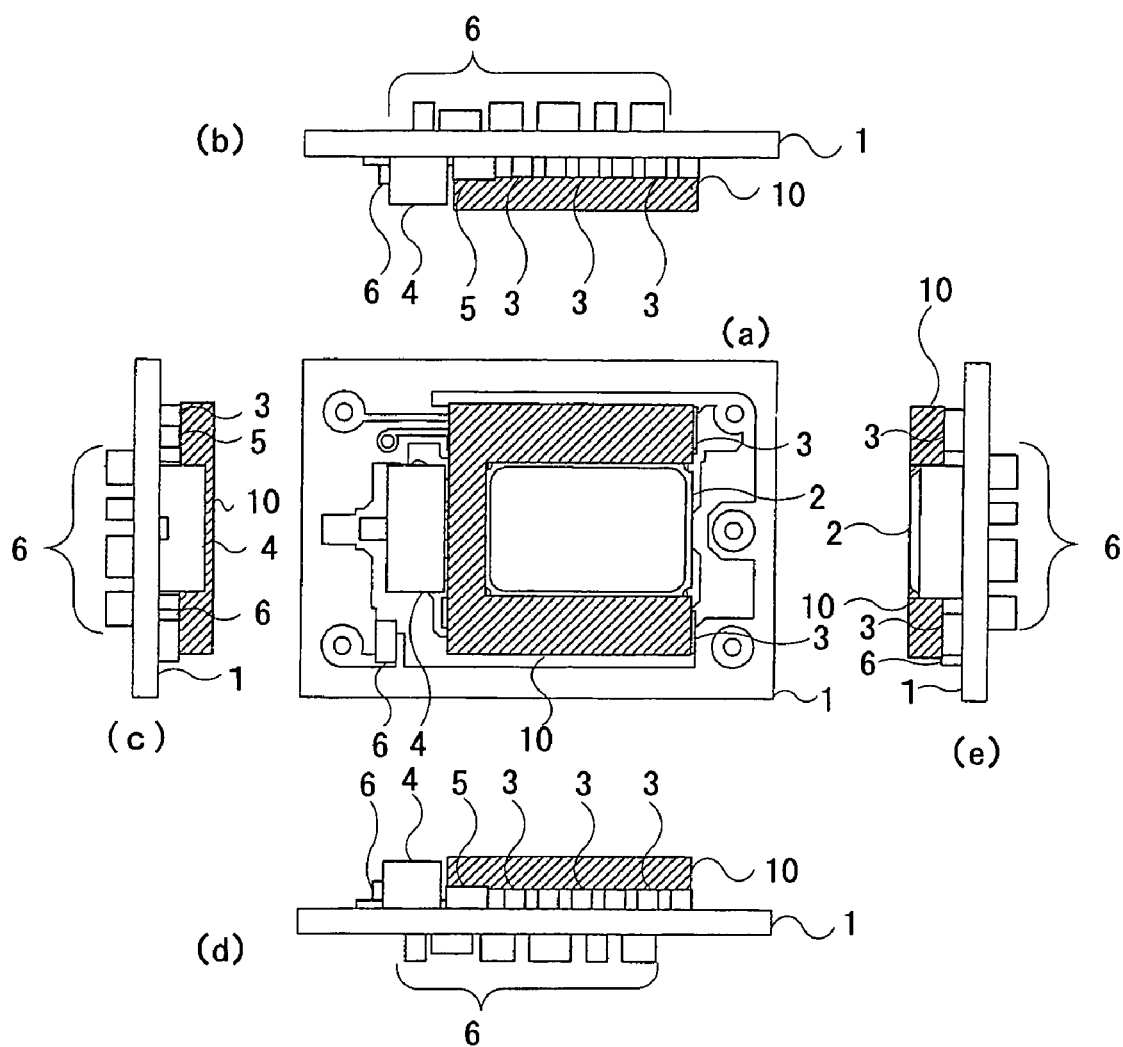
FIG. 1 is an explanatory drawing showing the structure of a substrate in an OCXO (this device) according to a preferred embodiment of the present invention, where (a) is a plan view, (b) is a top view, (c) is a left side view, (d) is a bottom view, and (e) is a right side view.

The structure of an oven controlled crystal oscillator according to a preferred embodiment of the present invention will be described with reference to FIG. 1. FIG. 1 is an explanatory drawing showing the structure of a substrate in an OCXO (this device) according to the embodiment of the present invention, where (a) is a plan view, (b) is a top view, (c) is a left side view, (d) is a bottom view, and (e) is a right side view.

Figure 4:
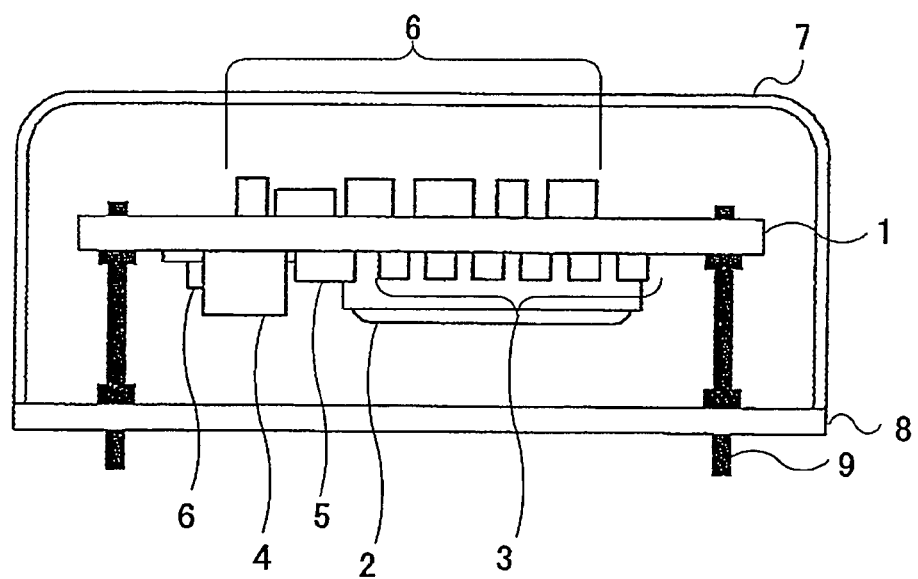
FIG. 4 is a sectional view showing the structure of a conventional oven controlled crystal oscillator.

The general structure of the OCXO according to the embodiment of the present invention is similar to that of the conventional OCXO shown in FIG. 4, so that the description thereof will be omitted here. However, note that the substrate on which a crystal resonator is mounted is secured in a space enclosed by the cover and the base.

Figure 5:
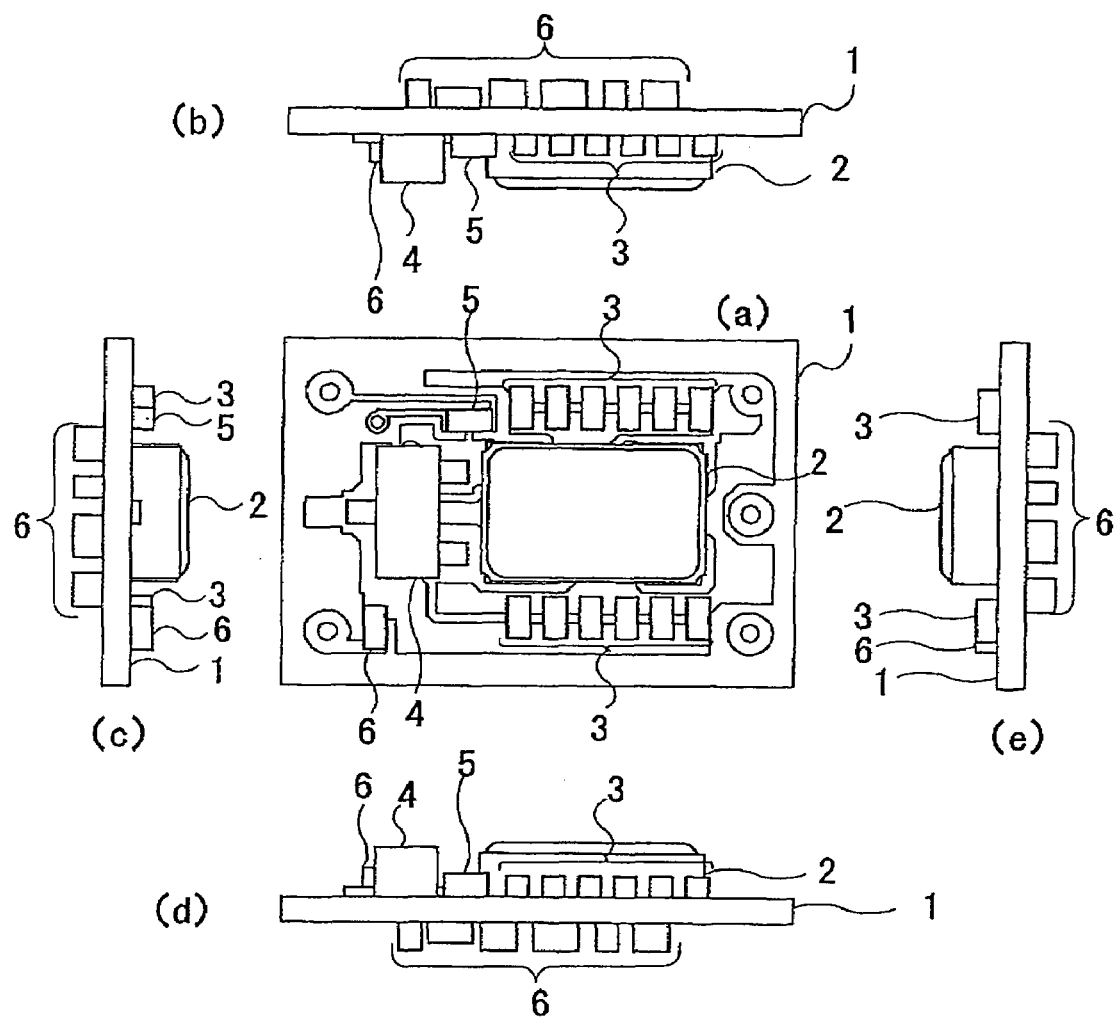
FIG. 5 is an explanatory drawing showing the structure of a substrate 1 in the conventional oven controlled crystal oscillator, where (a) is a plan view, (b) is a top view, (c) is a left side view, (d) is a bottom view, and (e) is a right side view.

As shown in FIG. 1, the kinds and arrangement of electronic components provided on both sides of a substrate 1 of the OCXO are the same as those in the conventional OCXO shown in FIGS. 4 and 5. The feature of this OCXO is that a high thermal conductivity plate 10 is placed as shown in FIG. 1(a) on the same side as a surface-mounted crystal resonator 2 to enclose the perimeter of the crystal resonator 2 in a U-shaped manner. The high thermal conductivity plate 10 corresponds to a "high thermal conductive member" as set forth in the appended claims.

The high thermal conductivity plate 10 is a plate made of a material having higher thermal conductivity than that of the substrate 1, such as, for example, a metal plate like a copper (Cu) plate or a ceramic plate. The material preferably has a low specific heat and is light and easily machined.

Specifically, the high thermal conductivity plate 10 is attached not only to substantially cover resistors 3 and a temperature sensor 5 arranged around the crystal resonator 2, but also to contact a transistor 4 and the crystal resonator 2. Further, the high thermal conductivity plate 10 is secured on electronic components with an adhesive made of a material having relatively high thermal conductivity (silicon or epoxy resin, etc). Therefore, the adhesive does not interfere with heat conduction.

Thus, heat from the resistors 3 and the transistor 4 is transmitted through the adhesive having relatively high thermal conductivity and the high thermal conductivity plate 10 higher in thermal conductivity than the substrate 1, so that the temperature difference among the crystal resonator 2, the temperature sensor 5, and the other electronic components in contact with the high thermal conductivity plate 10 can be reduced to reduce temperature variations in the substrate, thereby making it possible to output a more stable frequency regardless of the environmental temperature.

Further, as shown in FIGS. 1(b) to 1(e), since the height of the resistors 3 and the temperature sensor 5 provided on the substrate 1 (height from the substrate surface, or thickness) is lower than that of the crystal resonator 2 and the transistor 4, there is space above the resistors 3 to surround the perimeter of the crystal resonator 2. Therefore, this device is configured such that the high thermal conductivity plate 10 is formed to such a thickness as to fill in this space.

Thus, since the total size and thickness of the substrate 1 with the high thermal conductivity plate 10 mounted thereon are substantially the same as those in the conventional OCXO, this device can be constructed compact without changing the shape and size of the cover 7 shown in FIG. 5. This makes it possible not only to construct a compact OCXO having a high thermal conductivity plate without any reduction in size and weight, but also to reduce the material cost of the high thermal conductivity plate 10. Even if the high thermal conductivity plate 10 is formed in a U-shape, since it can keep a sufficient contact area with the resistors 3 and the crystal resonator 2, obtaining sufficiently proper thermal conductivity.

Note that, if the height of the resistors 3 is substantially the same as that of the crystal resonator 2, it is also possible to provide the high thermal conductivity plate 10 to cover the entire surface of the substrate 1 including the crystal resonator 2.

Further, though not shown in FIG. 1, the one side of the substrate 1 where the high thermal conductivity plate 10 is provided can also be covered with thermal insulating coating made of low thermal-conductivity resin or a thermal insulating sheet. This not only prevents the high thermal conductivity plate 10 from being displaced or stripped off, but also makes the high thermal conductivity plate 10 hard to radiate heat uniformly conducted therethrough to the outside, so that a thermally uniform state can be maintained, thereby making it possible to obtain more stable frequency-temperature characteristics. The thermal insulating coating and the thermal insulating sheet can be made of silicon resin or epoxy resin having low thermal conductivity. The thermal insulating coating or the thermal insulating sheet corresponds to a "thermal insulating member" as set forth in the appended claims.

Although a certain degree of thermal insulation performance can be expected even by using the thermal insulating resin or the thermal insulating sheet to cover only the high thermal conductivity plate 10 that is easy to radiate heat, if both sides of the substrate are covered therewith, higher thermal insulation performance can be achieved.

Figure 2:
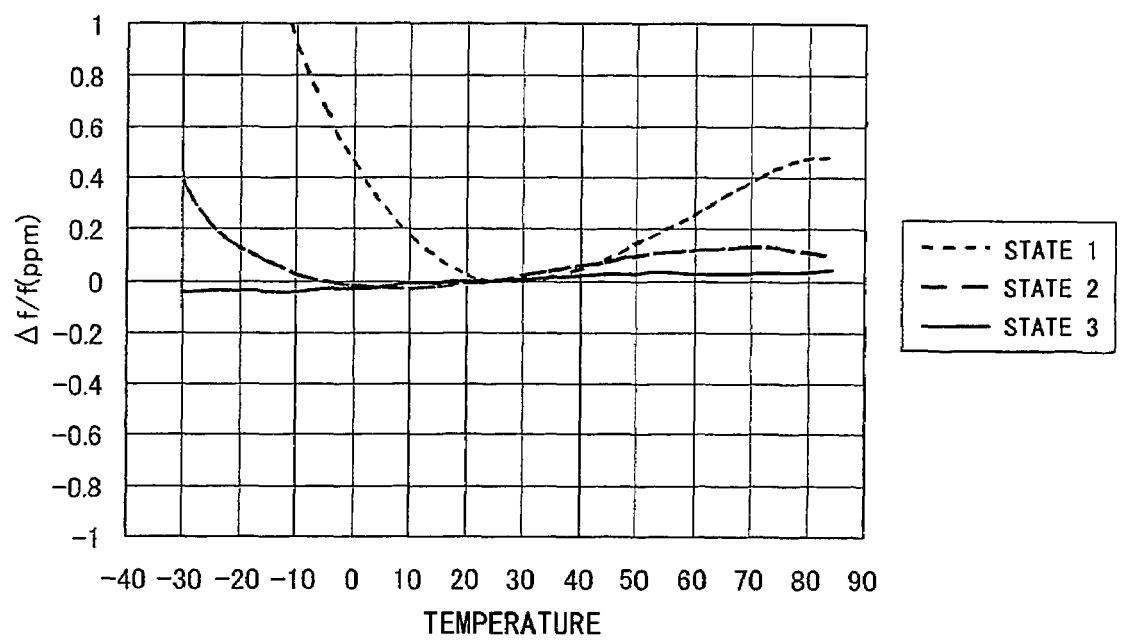
FIG. 2 is a graph showing the relationship between differences in material of a high thermal conductivity plate 10 in this device and frequency-temperature characteristics.

Referring next to FIG. 2, differences in frequency-temperature characteristics among different materials of the high thermal conductivity plate 10 will be described. FIG. 2 is a graph showing a relationship between differences in material of the high thermal conductivity plate 10 in this device and frequency-temperature characteristics.

In FIG. 2, "State 1" indicates frequency-temperature characteristics in case of no high thermal conductivity plate 10. When no high thermal conductivity plate 10 is provided, it is understood that the frequency-temperature characteristics vary by about 1 ppm or more in a temperature range of −30° C. to +80° C. (see "State 1").

"State 2" indicates frequency-temperature characteristics in case of use of a silicon plate as the high thermal conductivity plate 10. When the silicon plate is used as the high thermal conductivity plate 10, it is found that the variation in frequency-temperature characteristics falls within plus or minus 0.4 ppm in the temperature range of −30° C. to +80° C., and that the frequency-temperature characteristics are greatly improved compared to "State 1" where no high thermal conductivity plate 10 is provided.

Further, "State 3" indicates frequency-temperature characteristics in case of use of a copper plate as the high thermal conductivity plate 10. When the copper plate is used, the variation in frequency-temperature characteristics falls within plus or minus 0.1 ppm in the temperature range of −30° C. to +80° C., and the frequency-temperature characteristics are significantly improved compared to "State 1" and "State 2."

A comparison between "State 2" and "State 3" shows that better frequency-temperature characteristics can be obtained in "State 3." It is therefore understood that use of a material having higher thermal conductivity is preferable for the high thermal conductivity plate 10.

According to the embodiment of the present invention, the oven controlled crystal oscillator includes the high thermal conductivity plate 10 having high thermal conductivity and provided on one side of the substrate 1, where the crystal resonator 2 is provided, in such a manner to contact the resistors 3, the transistor 4, the crystal resonator 2, and the temperature sensor 5. Since heat from the resistors 3 and the transistor 4 as the heat generator can be transmitted to the crystal resonator 2 and the temperature sensor 5 rapidly with less heat loss so as to assure a uniform temperature inside the substrate 1, the reliability and accuracy of temperature control in the oven controlled crystal oscillator can be improved, thereby improving the frequency-temperature characteristics.

Further, according to this device, the high thermal conductivity plate 10 is bonded to the electronic components with an adhesive made of a resin having relatively high thermal conductivity, so that the frequency-temperature characteristics can be improved while not interfering with conduction of heat from the heat generator consisting such as of the resistors and the like.

Further, according to this device, the entire surface of the substrate on the side where the high thermal conductivity plate 10 is provided can also be covered with a resin having low thermal conductivity. In this case, heat radiation to the outside can be prevented and hence temperature can be kept in a uniform state, thereby more improving the frequency-temperature characteristics.

Furthermore, according to this device, the high thermal conductivity plate 10 is formed in a U-shape to a thickness substantially corresponding to a difference in height between the crystal resonator 2 and the resistors 3, and provided to surround the crystal resonator 2 in a space defined by the difference in height between the crystal resonator 2 and the resistors 3. Therefore, the high thermal conductivity plate 10 can be provided without changing the total size and thickness of the device. Further, since the high thermal conductivity plate 10 is in contact with the resistors 3 and the crystal resonator 2 with sufficiently large surface areas, proper thermal conductivity can be maintained. These advantages can reduce the material costs of the high thermal conductivity plate 10 and the cover.

Figure 3:
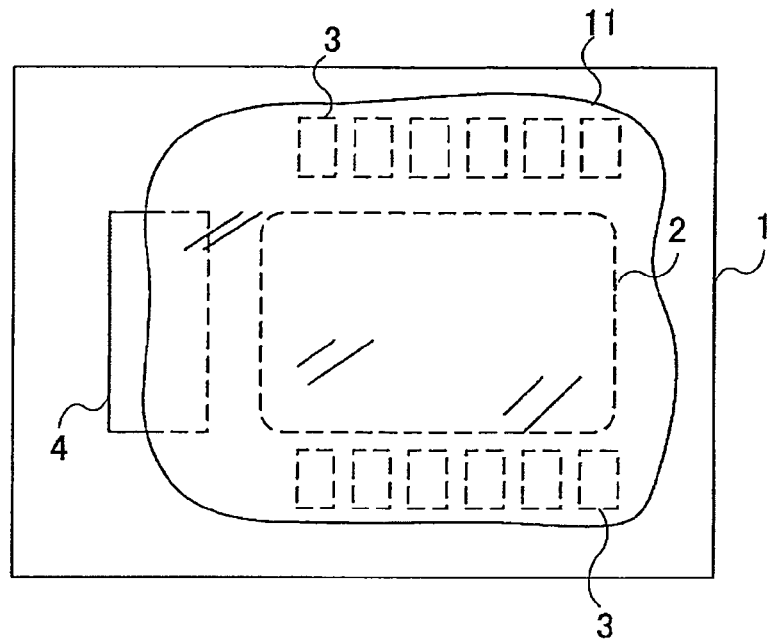
FIG. 3 is a plan view showing the structure of a substrate in an oven controlled crystal oscillator (another OCXO) according to another embodiment of the present invention.

Referring next to FIG. 3, another oven controlled crystal oscillator according to another embodiment of the present invention will be described. FIG. 3 is a plan view showing the structure of a substrate in the oven controlled crystal oscillator (another OCXO) according to another embodiment of the present invention. The structure of electronic components and the like in the crystal oscillator as another OCXO is the same as the OCXO shown in FIG. 1, so that the electronic components and the like are given the same reference numerals as those in FIG. 1.

As shown in FIG. 3, another OCXO features that a resin (high thermal conductive resin) 11 having high thermal conductivity is coated on one side of the substrate 1 instead of providing the high thermal conductivity plate 10 made of metal.

The high thermal conductive resin 11 is a resin having high thermal conductivity such as silicon resin or epoxy resin, and is coated to substantially cover the one side of the substrate using a technique such as to drop a moderate amount of resin after completion of mounting, on the substrate 1, the electronic components, namely the crystal resonator 2, the resistors 3, the transistor 4, the temperature sensor 5, and the other electronic components 6. The high thermal conductivity resin 11 is then dried and hardened.

Although the thermal conductivity of the high thermal conductive resin 11 is not so high compared to the above-mentioned high thermal conductivity plate 10, since mounting (coating) of the high thermal conductive resin 11 onto the substrate 1 is very easy and inexpensive, and the high thermal conductive resin 11 can closely contact the electronic components, a certain degree of thermal conduction can be expected, making it possible to improve the frequency-temperature characteristics compared to the conventional examples.

According to another embodiment of the present invention, the oven controlled crystal oscillator includes the high thermal conductivity resin 11 having high thermal conductivity and coated on one side of the substrate 1, where the crystal resonator 2 is provided, in such a manner to substantially cover the resistors 3, the transistor 4, the crystal resonator 2, and the temperature sensor 5. Since heat from the resistors 3 and the transistor 4 as the heat generator can be transmitted rapidly to the crystal resonator 2 and the temperature sensor 5 and hence temperature variations inside the substrate 1 can be reduced, the accuracy of temperature control in the oven controlled crystal oscillator can be improved, thereby improving the frequency-temperature characteristics.

Further, according to another oven controlled crystal oscillator, coating of the high thermal conductive resin 11 onto the substrate 1 is easy and inexpensive, so that proper frequency-temperature characteristics can be realized easily without major changes in the conventional processes for manufacturing conventional oven controlled crystal oscillators.

Further, like in the aforementioned oven controlled crystal oscillator, a thermal insulating resin having low thermal conductivity can be coated or the high thermal conductive resin 11 can be covered with a thermal insulating sheet after the high thermal conductive resin 11 is coated (and hardened). In such a case, heat radiation from the surface of the high thermal conductive resin 11 can be prevented and hence temperature can be kept more uniform, thereby further improving the frequency-temperature characteristics.

Any material other than the thermal insulating resin can be expected to have the same effects as long as the material has low thermal conductivity. For example, paper or plastic film can be used instead.

The present invention is suitable for oven controlled crystal oscillators having stable frequency-temperature characteristics.

What is claimed is:

1. An oven controlled crystal oscillator having a surface-mounted crystal resonator, a heat generator including a resistor and a transistor, and a temperature sensor on one side of a substrate, and other electronic components on the other side, the oven controlled crystal oscillator comprising
   a high thermal conductivity member made of a material having high thermal conductivity and provided on the side of the substrate, where the crystal resonator, the heat generator and the temperature sensor are provided, in such a manner to contact the crystal resonator, the heat generator, and the temperature sensor and to hold the crystal resonator, the heat generator, and the temperature sensor with the substrate.

2. The oven controlled crystal oscillator according to claim 1, wherein the high thermal conductivity member is a metal plate, a ceramic plate, or a silicon plate, and is provided on the substrate bonded with an adhesive having high thermal conductivity.

3. An oven controlled crystal oscillator having a surface-mounted crystal resonator, a heat generator including a resistor and a transistor, and a temperature sensor on one side of a substrate, and other electronic components on the other side, the oven controlled crystal oscillator comprising
   a high thermal conductivity member made of a material having high thermal conductivity and provided on the side of the substrate, where the crystal resonator, the heat generator and the temperature sensor are provided, in such a manner to contact the crystal resonator, the heat generator, and the temperature sensor,
   the high thermal conductivity member being a metal plate, a ceramic plate, or a silicon plate, and being provided on the substrate through an adhesive having high thermal conductivity, and
   the high thermal conductivity member being provided to cover the resistor thinner in thickness than the crystal resonator and contact the side faces of the crystal resonator.

4. The oven controlled crystal oscillator according to claim 3, wherein the high thermal conductivity member is provided to contact a side face of the transistor.

5. An oven controlled crystal oscillator having a surface-mounted crystal resonator, a heat generator including a resistor and a transistor, and a temperature sensor on one side of a substrate, and other electronic components on the other side, the oven controlled crystal oscillator comprising
   a high thermal conductivity member made of a material having high thermal conductivity and provided on the side of the substrate, where the crystal resonator, the heat generator and the temperature sensor are provided, in such a manner to contact the crystal resonator, the heat generator, and the temperature sensor,
   the high thermal conductivity member being formed by coating a resin having high thermal conductivity.

6. The oven controlled crystal oscillator according to claim 1, wherein a thermal insulating member having low thermal conductivity is provided to cover an entire surface of the one side of the substrate where the high thermal conductivity member is provided.

7. The oven controlled crystal oscillator according to claim 2, wherein a thermal insulating member having low thermal conductivity is provided to cover an entire surface of the one side of the substrate where the high thermal conductivity member is provided.

8. The oven controlled crystal oscillator according to claim 3, wherein a thermal insulating member having low thermal conductivity is provided to cover the high thermal conductivity member.

9. The oven controlled crystal oscillator according to claim 4, wherein a thermal insulating member having low thermal conductivity is provided to cover the high thermal conductivity member.

10. The oven controlled crystal oscillator according to claim 5, wherein a thermal insulating member having low thermal conductivity is provided to cover the high thermal conductivity member.

11. An oven controlled crystal oscillator having a surface-mounted crystal resonator, a heat generator including a resistor and a transistor, and a temperature sensor on one side of a substrate, and other electronic components on the other side, the oven controlled crystal oscillator comprising
   a high thermal conductivity member made of a material having high thermal conductivity and provided on the side of the substrate, where the crystal resonator, the heat generator and the temperature sensor are provided, in such a manner to contact the crystal resonator, the heat generator, and the temperature sensor,
   the high thermal conductivity member being a metal plate, a ceramic plate, or a silicon plate, and being provided on the substrate through an adhesive having high thermal conductivity, and
   the high thermal conductivity member being a copper plate.

12. The oven controlled crystal oscillator according to claim 3, wherein the high thermal conductivity member is a copper plate.

13. The oven controlled crystal oscillator according to claim 4, wherein the high thermal conductivity member is a copper plate.

14. An oven controlled crystal oscillator having a surface-mounted crystal resonator, a heat generator including a resistor and a transistor, and a temperature sensor on one side of a substrate, and other electronic components on the other side, the oven controlled crystal oscillator comprising
   a high thermal conductivity member made of a material having high thermal conductivity and provided on the side of the substrate, where the crystal resonator, the heat generator and the temperature sensor are provided, in such a manner to contact the crystal resonator, the heat generator, and the temperature sensor, the high thermal conductivity member being a metal plate, a ceramic plate, or a silicon plate, and being provided on the substrate through an adhesive having high thermal conductivity, and the adhesive being silicon resin or epoxy resin.

15. The oven controlled crystal oscillator according to claim 5, wherein the resin of claim 5 is silicon resin or epoxy resin.

16. The oven controlled crystal oscillator according to claim 6, wherein the thermal insulating member having low thermal conductivity is formed by coating a high thermal insulating resin.

17. The oven controlled crystal oscillator according to claim 7, wherein the thermal insulating member having low thermal conductivity is formed by coating a high thermal insulating resin.

18. The oven controlled crystal oscillator according to claim 6, wherein the thermal insulating member having low thermal conductivity is formed by coating a thermal insulating sheet.

19. The oven controlled crystal oscillator according to claim 7, wherein the thermal insulating member having low thermal conductivity is formed by coating a thermal insulating sheet.

* * * * *